(12) United States Patent
Lin

(10) Patent No.: US 10,147,816 B2
(45) Date of Patent: Dec. 4, 2018

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jing Lin, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 5 days.

(21) Appl. No.: 15/397,949

(22) Filed: Jan. 4, 2017

(65) Prior Publication Data
US 2017/0194496 A1 Jul. 6, 2017

(51) Int. Cl.
H01L 29/66 (2006.01)
H01L 29/78 (2006.01)
(Continued)

(52) U.S. Cl.
CPC .... *H01L 29/7848* (2013.01); *H01L 21/02129* (2013.01); *H01L 21/02271* (2013.01); *H01L 21/02532* (2013.01); *H01L 21/308* (2013.01); *H01L 21/31111* (2013.01); *H01L 21/76224* (2013.01); *H01L 21/823418* (2013.01); *H01L 21/823431* (2013.01);
(Continued)

(58) Field of Classification Search
CPC ............. H01L 2924/13067; H01L 2029/7851
See application file for complete search history.

(56) References Cited

U.S. PATENT DOCUMENTS

| 8,878,300 | B1* | 11/2014 | Liu | H01L 29/785 257/368 |
|---|---|---|---|---|
| 2014/0264279 | A1* | 9/2014 | Cheng | H01L 29/7853 257/27 |
| 2015/0035023 | A1* | 2/2015 | Kim | H01L 29/785 257/288 |
| 2015/0072494 | A1* | 3/2015 | Lin | H01L 29/66795 438/283 |

(Continued)

OTHER PUBLICATIONS

The European Patent Office (EPO) The Extended European Search Report for 16207265.6 dated Jun. 8, 2017 8 Pages.

*Primary Examiner* — Angel Roman
(74) *Attorney, Agent, or Firm* — Anova Law Group, PLLC

(57) ABSTRACT

A fabrication method includes providing a base having a first transistor region and a second transistor region; forming a first stress layer in the first transistor region and a second stress layer in the second transistor region; forming a first covering layer on a surface of the first stress layer and a second covering layer on a surface of the second stress layer, with a gap between the first and the second covering layers exposing the surface of the base, and the neighboring side walls of the first and second covering layers have vertices pointing to each other; forming an isolation layer filling up the gap, and the isolation layer is higher than the vertices, exposing top surfaces of the first and second covering layers; and forming a third covering layer on the first covering layer and a fourth covering layer on the second covering layer.

20 Claims, 5 Drawing Sheets

(51) Int. Cl.
  *H01L 21/8234* (2006.01)
  *H01L 21/762* (2006.01)
  *H01L 21/02* (2006.01)
  *H01L 21/311* (2006.01)
  *H01L 29/10* (2006.01)
  *H01L 29/06* (2006.01)
  *H01L 21/308* (2006.01)
  *H01L 27/088* (2006.01)
  *H01L 21/8238* (2006.01)
  *H01L 29/417* (2006.01)
(52) U.S. Cl.
  CPC ........... *H01L 21/823481* (2013.01); *H01L 21/823821* (2013.01); *H01L 27/0886* (2013.01); *H01L 29/0649* (2013.01); *H01L 29/1079* (2013.01); *H01L 29/41791* (2013.01); *H01L 29/66636* (2013.01)

(56) References Cited

U.S. PATENT DOCUMENTS

| | | | |
|---|---|---|---|
| 2015/0104918 A1* | 4/2015 | Liu | H01L 29/42392 438/283 |
| 2015/0137181 A1 | 5/2015 | Basker et al. | |
| 2015/0214228 A1* | 7/2015 | Koh | H01L 27/0924 257/369 |
| 2015/0214366 A1 | 7/2015 | Chang et al. | |
| 2015/0249153 A1 | 9/2015 | Morin et al. | |
| 2015/0318217 A1* | 11/2015 | Wu | H01L 27/0922 257/369 |
| 2016/0064483 A1* | 3/2016 | Kelly | H01L 29/0847 257/401 |
| 2016/0111339 A1* | 4/2016 | Zang | H01L 21/823814 257/369 |
| 2016/0204105 A1* | 7/2016 | Zeng | H01L 21/823807 257/401 |
| 2017/0186654 A1* | 6/2017 | Li | H01L 21/823814 |
| 2017/0243760 A1* | 8/2017 | Chao | H01L 29/41791 |

* cited by examiner

US 10,147,816 B2

SEMICONDUCTOR STRUCTURE AND FABRICATION METHOD THEREOF

CROSS-REFERENCES TO RELATED APPLICATIONS

This application claims the priority of Chinese patent application No. 201610006664.8, filed on Jan. 6, 2016, the entirety of which is incorporated herein by reference.

FIELD OF THE INVENTION

The present invention generally relates to the field of semiconductor manufacturing technology and, more particularly, relates to semiconductor structures and fabrication techniques thereof.

BACKGROUND

With the rapid development of semiconductor manufacturing technologies, semiconductor devices are developed toward the direction of higher component densities and integration degrees. To increase the integration degree of semiconductor devices, the density of transistors is continuously increasing while the space among transistors is decreasing.

When semiconductor devices are developed toward higher integration degrees, the problem of decreased channel carrier mobility can occur. To increase the channel carrier mobility of transistors, a technology based on strained silicon has been introduced, in which a layer of crystal with different lattice constants from the Si substrate is epitaxially grown in the drain and source regions of transistors. Further, to electrically connect the drain and source regions with external circuits, the fabrication method of semiconductor structures should include forming a metal silicide on the formed crystal layer.

The metal silicide is formed by first forming a covering layer on the formed crystal layer and then forming a metal layer on the covering layer. The metal ions in the metal layer can diffuse into the covering layer to form the metal silicide.

However, semiconductor devices made by such current technologies tend to cause short-circuit among different devices in the formed semiconductor structure, leading to malfunction of the semiconductor devices. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a base having a first transistor region and a second transistor region adjacent to the first transistor region; and forming a first stress layer in the first transistor region and a second stress layer in the second transistor region, with the first stress layer and the second stress layer exposing part of a surface of the base. The method also includes forming a first covering layer on a surface of the first stress layer and a second covering layer on a surface of the second stress layer by epitaxial growth, with a gap between the first covering layer and the second covering layer exposing the surface of the base, and the neighboring side walls of the first covering layer and the second covering layer have vertices pointing to each other; forming an isolation layer filling up the gap, and a surface of the isolation layer is higher than the vertices, exposing top surfaces of the first covering layer and the second covering layer; and forming a third covering layer on the first covering layer and a fourth covering layer on the second covering layer by epitaxial growth.

Another aspect of the present disclosure includes a semiconductor structure. The semiconductor structure includes a base having a first transistor region and a second transistor region; a first stress layer in the first transistor region and a second stress layer in the second transistor region of the base, wherein the base is exposed by the first stress layer and the second stress layer; a first covering layer and a second covering layer formed on surfaces of the first stress layer and the second stress layer, respectively, and side walls of the first covering layer and the second covering layer have vertices pointing to each other; an isolation layer between the first covering layer and the second covering layer, and a top surface of the isolation layer is higher than the vertices, exposing the surfaces of the first covering layer and the second covering layer; and a third covering layer and a fourth covering layer formed on the surfaces of the first covering layer and the second covering layer, respectively.

Other aspects of the present disclosure can be understood by those skilled in the art in light of the description, the claims, and the drawings of the present disclosure.

DETAILED DESCRIPTION

Reference will now be made in detail to the exemplary embodiments of the invention, which are illustrated in the accompanying drawings. Wherever possible, the same reference numbers will be used throughout the drawings to refer to the same or similar parts.

Figure 1:
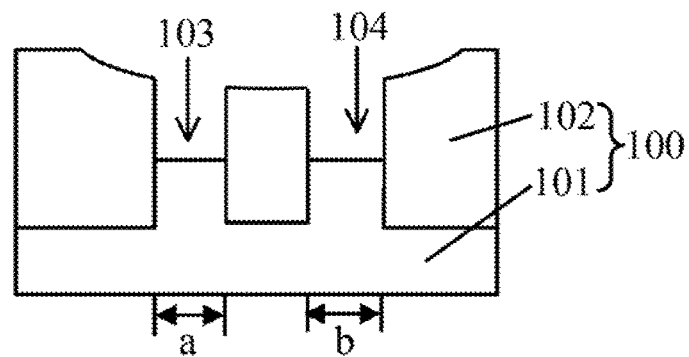
FIGS. 1~3 illustrate certain semiconductor structures corresponding to an existing fabrication process of a semiconductor structure.
Figure 2:
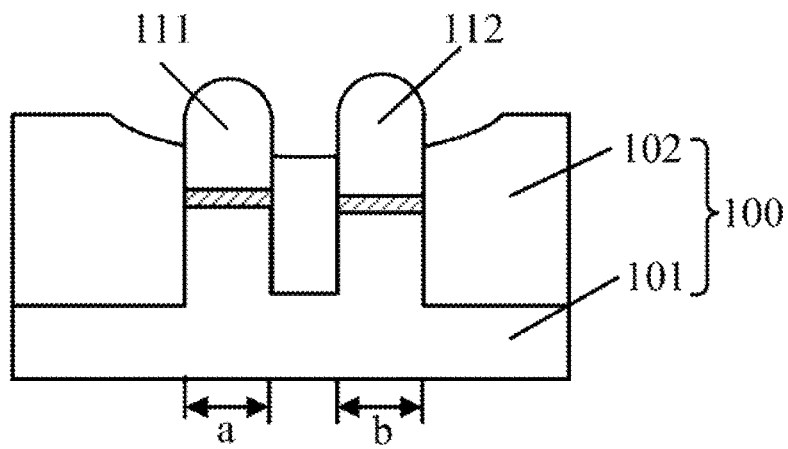
Figure 3:
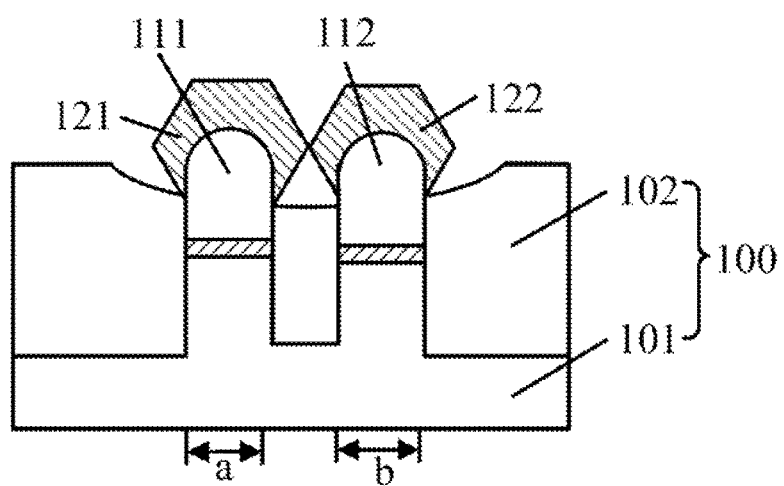

As described above, semiconductor structures formed by current methods may have certain problems, including that the metal silicide of different semiconductor devices can easily be short-circuited. FIGS. 1~3 show a semiconductor structure corresponding to an existing fabrication process.

As shown in FIG. 1, a base 100 containing a first transistor region "a" and an adjacent second transistor region "b" is provided. The base 100 includes a substrate 101 and an isolation structure 102. The substrate 101 contains two fin portions, a first fin portion and a second fin portion. The isolation structure 102 is formed on the substrate 101 and is around the first fin portion and the second fin portion. The top surfaces of the first fin portion and the second fin portion are exposed.

As shown in FIG. 1, the substrate 101 is then etched, forming a first trench 103 in the first transistor region "a" and a second trench 104 in the second transistor region "b".

Before etching the substrate 101, the fabrication method further includes forming a first gate structure and a second gate structure in the first transistor region "a" and the second transistor region "b" of the base 100, respectively. The substrate 101 under the first gate structure and the second gate structure forms the first channel and the second channel, respectively.

As shown in FIG. 2, a first stress layer 111 is formed in the first trench 103 (FIG. 1) of the first transistor region "a", and a second stress layer 112 is formed in the second trench 104 (FIG. 1) of the second transistor region "b".

As shown in FIG. 3, a first covering layer 121 that covers the first stress layer 111 is formed in the first transistor region "a", and a second covering layer 122 that covers the second stress layer 112 is formed in the second transistor region "b". The first covering layer 121 and the second covering layer 122 can be formed via epitaxial growth. The first covering layer 121 and the second covering layer 122 are used to form the metal silicide.

In the process of etching the substrate 101 in the first transistor region "a" and the second transistor region "b" to form the first trench 103 and the second trench 104, the isolation structure 101 around the first trench 103 and the second trench 104 is also etched, forming a depressed area in the isolation structure 102. As a result, the surface of the first channel is higher than the surface of the isolation structure 102 between the first fin portion and the second fin portion, and the surface of the second channel is higher than the surface of the isolation structure 102 between the first fin portion and the second fin portion.

However, in order for the subsequently formed first stress layer 111 and second stress layer 112 to provide sufficient stress for the first channel and the second channel, the top surface of the first stress layer 111 should be higher than or at the same level with the surface of the first channel, and the surface of the second stress layer 112 should be higher than or at the same level with the surface of the second channel. The first stress layer 111 and the second stress layer 112 may protrude from the surface of the isolation structure 102.

As shown in FIG. 3, in the process of forming the first covering layer 121 and the second covering layer 122 that cover the first stress layer 111 and the second stress layer 112, for example, via epitaxial growth, the growth directions of the first covering layer 121 and the second covering layer 122 are not limited, and the growth rates of the crystal forming the first covering layer 121 and the second covering layer 122 are different along different directions. Thus, vertices can easily form along the faster growth directions of the first covering layer 121 and the second covering layer 122. The first covering layer 121 and the second covering layer 122 can easily contact with each other at the vertices, causing the subsequently formed metal silicide short-circuited.

The present disclosure provides an improved fabrication process and semiconductor structures thereof. According to the disclosed semiconductor structures and methods, the short-circuit problem and other problems may be overcome by, for example, forming an isolation layer and additional covering layers.

In the disclosed semiconductor structure, after forming the first stress layer and the second stress layer, the first covering layer that covers the first stress layer and the second covering layer that covers the second stress layer are formed. The first covering layer and the second covering layer are used to provide crystalline seeds for the subsequently formed third covering layer and forth covering layer, so that the crystallographic orientations of the third covering layer and the fourth covering layer are the same with the crystallographic orientations of the first covering layer and the second covering layer. After forming the first covering layer and the second covering layer, an isolation layer filling up the gap between the first covering layer and the second covering layer is formed. The surface of the isolation layer is higher than the vertices of the first covering layer and the second covering layer. The growth directions of the third covering layer and the fourth covering layer are limited during the epitaxial growth process of forming the third covering layer and the fourth covering layer. Thus, the third covering layer and the fourth covering layer do not form at the vertices of the first covering layer and the second covering layer, and the contact between the third covering layer and the fourth covering layer is avoided. The contact between the metal silicide in the first transistor region and the second transistor region is also avoided, and the electrical insulation among different semiconductor devices can be achieved.

Correspondingly, the disclosed invention also provides a semiconductor structure. In the disclosed semiconductor structure, an isolation layer is between the first covering layer and the second covering layer. The surface of the isolation layer is higher than the vertices of the first covering layer and the second covering layer, and the vertices are not covered by the third covering layer or the fourth covering layer. Thus, the contact between the third covering layer and the fourth covering layer can be avoided. In addition, the first covering layer and the second covering layer are relatively thin and, therefore, it may be difficult for the first covering layer and the second covering layer to contact with each other.

Figure 12:
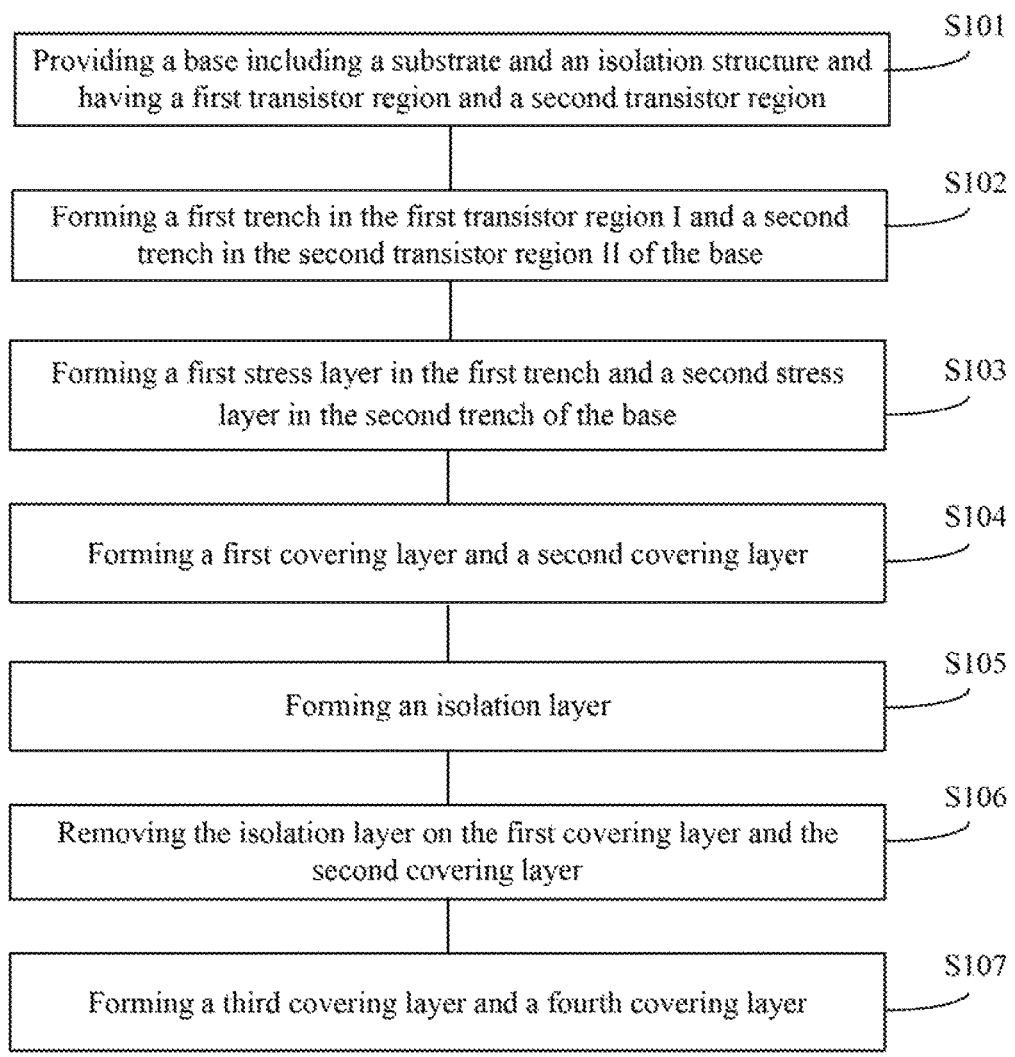
FIG. 12 illustrates an exemplary fabricating process of a semiconductor device consistent with the disclosed embodiments.

FIG. 12 illustrates an exemplary fabrication process of a semiconductor structure consistent with the disclosed embodiments; and FIGS. 4~10 illustrate semiconductor structures corresponding to certain stages of the exemplary fabrication process.

Figure 4:
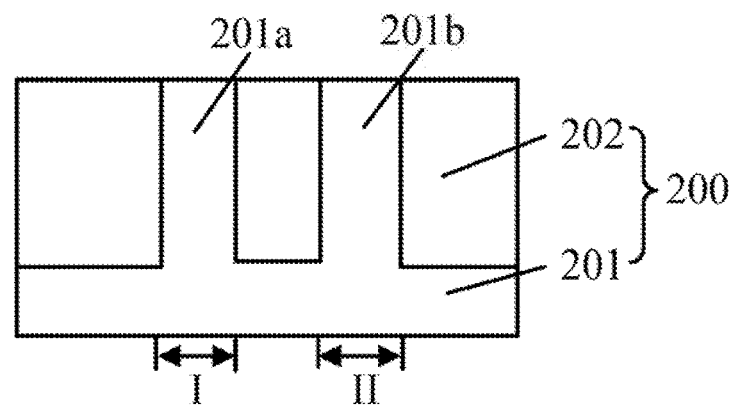
FIGS. 4~10 illustrate semiconductor structures corresponding to certain stages of a fabrication process of a semiconductor structure consistent with the disclosed embodiments.

As shown in FIG. 12, at the beginning of the fabrication process, a base is provided (S101). FIG. 4 illustrates a corresponding semiconductor structure.

As shown in FIG. 4, a base 200 containing a first transistor region I and a second transistor region II is provided. The first transistor region I and the second transistor region II are used to form a fin-field effect transistor (Fin-FET). The first transistor region I and the second transistor region II can also be used to form a planar transistor or other semiconductor device.

The base 200 may include a substrate 201 and an isolation structure 202 on the substrate 201. The substrate 201 may contain a first fin portion 201a in the first transistor region I and a second fin portion 201b in the second transistor region II. The side walls of the first fin portion 201a and the second fin portion 201b are covered by the isolation structure 202, and the top surfaces of the first fin portion 201a and the second fin portion 201b are exposed.

Further, the first fin portion 201a and the second fin portion 201b are used to form the drain and/or source region(s) of the Fin-FET. In one embodiment, the substrate 201 is made of silicon. In other embodiments, the substrate 201 can also be made of any other appropriate semiconductor material, such as germanium, silicon germanium or silicon on an insulator.

In one embodiment, the isolation structure 202 is a shallow trench isolation structure, and the isolation structure 202 may be made of silicon oxide. In other embodiments, the isolation structure 202 can also be silicon nitride or silicon oxynitride.

Subsequently in the fabrication process, a first stress layer may be formed in the first transistor region I of the base 200 and a second stress layer may be formed in the second transistor region II of the base 200. The surface of the base 200 may be exposed by the first stress layer and the second stress layer. The first stress layer and the second stress layer may be used to provide corresponding stress for channels of the transistor.

Further, as described below, before forming the first stress layer in the first transistor region I of the base 200 and the second stress layer in the second transistor region II of the base 200, a first gate structure may be formed in the first transistor region I of the base 200 and a second gate structure may be formed in the second transistor region II of the base 200. The substrate 201 under the first gate structure forms the first channel, and the substrate 201 under the second gate structure forms the second channel. The first stress layer is in the first fin portion 201a on the sides of the first gate structure, and the second stress layer is in the second fin portion 201b on the sides of the second gate structure.

Figure 5:
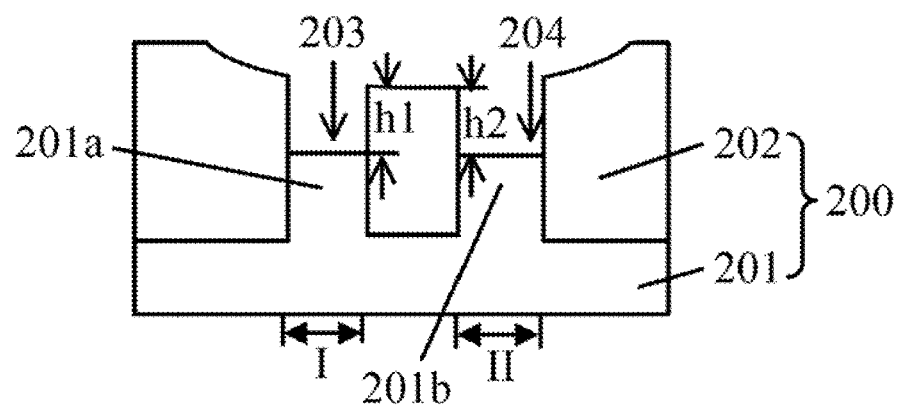

Returning to FIG. 12, after providing the base containing the first transistor region and the second transistor region, a first trench may be formed in the first transistor region of the base and a second trench may be formed in the second transistor region of the base (S102). FIG. 5 illustrates a corresponding semiconductor structure.

As shown in FIG. 5, a first trench 203 may be formed in the first transistor region I of the base 200 and a second trench 204 may be formed in the second transistor region II of the base 200.

More specifically, a mask layer may be first formed on the surface of the base 200. The surface of the base 200 in the first transistor region I, the surface of the base 200 in the second transistor region II, and the surface of the isolation structure 202 between the first transistor region I and the second transistor region II may be exposed by the mask layer.

In one embodiment, the surface of the first fin portion 201a, the surface of the second fin portion 201b, and the surface of the isolation structure 202 between the surface of the first fin portion 201a and the surface of the second fin portion 201b are exposed by the mask layer.

The mask layer may be made of a material different from the material of the substrate 201 and the isolation structure 202. In one embodiment, the mask layer is made of silicon nitride.

As shown in FIG. 5, the base 200 may then be etched using the mask layer as a mask. The first trench 203 is then formed in the first transistor region I, and the second trench 204 is formed in the second transistor region II. Specifically, in one embodiment, the first fin portion 201a is etched to form the first trench 203 and the second fin portion 201b is etched to form the second trench 204.

Further, in the process of etching the first fin portion 201a to form the first trench 203 and etching the second fin portion 201b to form the second trench 204, the isolation structure 202 around the first trench 203 and the second trench 204 may also be etched, forming a depressed area in the isolation structure 202, which may cause the surface of subsequently-formed first channel higher than the surface of the isolation structure 202 between the first fin portion 201a and the second fin portion 201b, and cause the surface of the second channel higher than the surface of the isolation structure 202 between the first fin portion 201a and the second fin portion 201b.

In one embodiment, the first trench 203 and the second trench 204 are formed by dry etching the first fin portion 201a and the second fin portion 201b. In other embodiments, the first fin portion 201a and the second fin portion 201b can also be etched using a wet-etching method or using the combination of the dry and wet etching methods.

In one embodiment, the distance from the highest point of the isolation structure 202 between the first fin portion 201a and the second fin portion 201b to the bottom of the first trench 203 may form the depth 'h1' of the first trench 203. The distance from the highest point of the isolation structure 202 between the first fin portion 201a and the second fin portion 201b to the bottom of the second trench 204 may form the depth 'h2' of the second trench 204.

In the process of etching the first fin portion 201a and the second fin portion 201b to form the first trench 203 and the second trench 204, the isolation structure 202 around the first trench 203 and the second trench 204 is also etched. Thus, it is hard to increase the depth h1 of the first trench 203 and the depth h2 of the second trench 204. Specifically, in one embodiment, the depths h1 of the first trench 203 and the depth h2 of the second trench 204 are 50~100 Å.

Figure 6:
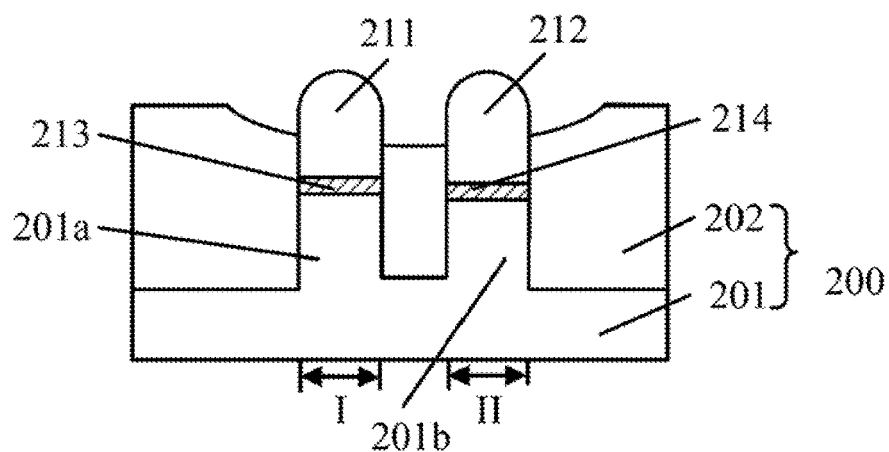

Returning to FIG. 12, after forming the first trench and the second trench, a first stress layer may be formed in the first trench of the base and a second stress layer may be formed in the second trench of the base (S103). FIG. 6 illustrates a corresponding semiconductor structure.

As shown in FIG. 6, a first stress layer 211 is then formed in the first trench 203 (FIG. 5), and a second stress layer 212 is formed in the second trench 204 (FIG. 5).

The surface of the first channel is higher than the surface of the isolation structure 202 between the first fin portion 201a and the second fin portion 201b. In the process of forming the first stress layer 211 in the first trench 203, in order for the first stress layer 211 to provide sufficient stress for the first channel, the top surface of the first stress layer 211 may be higher than the surface of the first channel or at the same level with the surface of the first channel. Thus, the thickness of the first stress layer 211 is larger than the depth h1 of the first trench 203, causing the first stress layer 211 to protrude from the surface of the isolation structure 202.

Similarly, the surface of the second channel is higher than the surface of the isolation structure 202 between the first fin portion 201a and the second tin portion 201b. In the process of forming the second stress layer 212 in the second trench 204, in order for the second stress layer 212 to provide sufficient stress for the second channel, the top surface of the second stress layer 212 may be higher than the surface of the second channel or at the same level with the surface of the second channel. Thus, the thickness of the second stress layer 212 is larger than the depth h2 of the second trench 204, causing the second stress layer 212 to protrude from the surface of the isolation structure 202.

In one embodiment, the first transistor region I is used to form a PMOS transistor. Correspondingly, the first stress layer 211 may be made of silicon germanium, and the germanium concentration may be in a range of 25%~60%. In other embodiments, the first transistor region I can also be used to form an NMOS transistor, and the corresponding first stress layer may be made of silicon carbide.

In one embodiment, the second transistor region II is used to form a PMOS transistor. Correspondingly, the second stress layer 212 is made of silicon germanium, and the germanium concentration is 25%~60%. In other embodiments, the second transistor region can also be used to form an NMOS transistor, and the corresponding second stress layer may be made of silicon carbide.

In the process of forming the first stress layer 211 in the first trench 203, if the thickness of the first stress layer 211 is too large, the integration degree of semiconductor devices can be affected; if the thickness of the first stress layer 211 is too small, it may be hard for the first stress layer 211 to provide sufficient stress for the first transistor channel. In one embodiment, the thickness of the first stress layer 211 may be in a range of approximately 100~300 Å.

Similarly, in the process of forming the second stress layer 212 in the second trench 204, if the thickness of the second stress layer 212 is too large, the integration degree of semiconductor devices can be affected; if the thickness of the second stress layer 212 is too small, it is hard for the second stress layer 212 to provide sufficient stress for the second transistor channel. In one embodiment, the thickness of the second stress layer 212 may be in a range of approximately 100~300 Å.

In one embodiment, the first stress layer 211 and the second stress layer 212 are fabricated by a selective epitaxial technique. The reactive gas for the selective epitaxial technique may include the silicon source gas, germanium source gas, chlorine gas, and hydrogen gas. The silicon source gas may be $SiH_4$, $SiH_2C_2$, or $Si_2Cl_6$ with a flow rate in a range of approximately 1 slm~1000 sccm. The germanium source gas is $GeH_4$ with a flow rate in a range of approximately 500 sccm~1000 sccm. The flow rates of the chlorine gas and the hydrogen gas may be in a range of approximately 0.1 slm~50 slm.

In one embodiment, before forming the first stress layer 211, the disclosed fabrication method may further include forming a first seed layer 213 in the first trench 203 by epitaxial growth. The first seed layer 213 may be used to smoothly change the lattice constant from the substrate 201 to the first stress layer 211, and to increase the lattice match between the first stress layer 211 and the crystal interface on which the first stress layer grows. Thus, the defects in the first stress layer 211 may be reduced and the crystalline quality of the first stress layer 211 may be improved.

In one embodiment, the substrate 201 is made of silicon, and the first stress layer 211 is made of silicon germanium crystal. The first seed layer 213 is made of silicon germanium crystal with a germanium concentration lower than the germanium concentration in the first stress layer 211. Specifically, the germanium concentration in the first seed layer 213 may be in a range of approximately 5%~25%.

Similarly, in one embodiment, before forming the second stress layer 212, the disclosed fabrication method further includes forming a second seed layer 214 in the second trench 204 by epitaxial growth. The second seed layer 214 is used to smoothly change the lattice constant from the substrate 201 to the second stress layer 212, and to increase the lattice match between the second stress layer 212 and the crystal interface on which the second stress layer grows. Thus, the defects in the second stress layer 212 may be reduced and the crystalline quality of the second stress layer 212 may be improved.

In one embodiment, the substrate 201 is made of silicon, and the second stress layer 212 is made of silicon germanium crystal. The second seed layer 214 is made of silicon germanium crystal with a germanium concentration lower than the germanium concentration in the second stress layer 212. Specifically, the germanium concentration in the second seed layer 214 may be in a range of approximately 5%~25%.

Further, a doping process may be performed on the first stress layer 211 and the second stress layer 212 to form the source and/or drain region(s). Specifically, the first stress layer 211 and the second stress layer 212 are doped to form the source and drain regions by the on-site doping method during the process of the selective epitaxial growth. After forming the first stress layer 211 and the second stress layer 212, the ion implantation technique may also be employed to fabricate the source and drain regions.

Further, in one embodiment, before forming the first seed layer 213 and the second seed layer 214, the disclosed fabrication method of a semiconductor structure may also include cleaning the bottom and side walls of the first trench 203 and the second trench 204 to remove the oxidation layer at the bottom and on the side walls of the first trench 203 and the second trench 204. Specifically, the bottom and side walls of the first trench 203 and the second trench 204 may be cleaned by a hydrofluoric acid solution.

Figure 7:
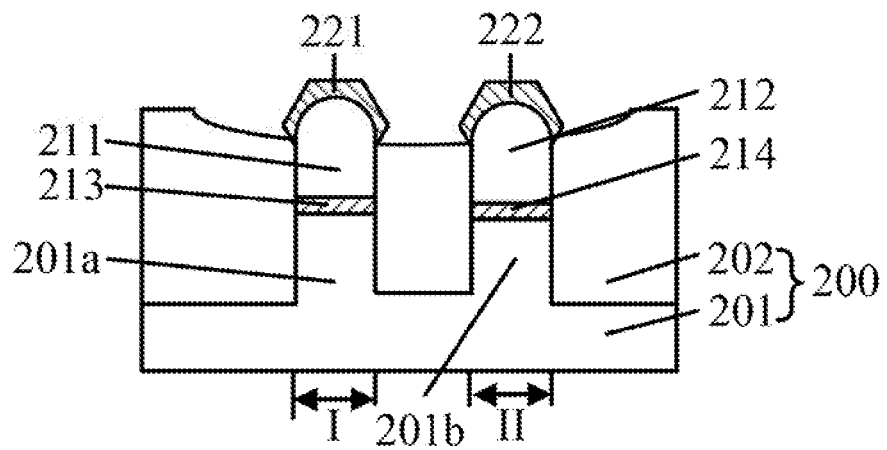

Returning to FIG. 12, after forming the first stress layer and the second stress layer, a first covering layer and a second covering layer may be formed (S104). FIG. 7 illustrates a corresponding semiconductor structure.

As shown in FIG. 7, the first covering layer 221 may be formed on the surface of the first stress layer 211 and the second covering layer 222 may be formed on the surface of the second stress layer 212 by, for example, an epitaxial growth process. There may be a gap between the first covering layer 221 and the second covering layer 222, and the gap may expose the surface of the base 200. The adjacent side wall surfaces of the first covering layer 221 and the second covering layer 222 have vertices pointing to the second covering layer 221 and the first covering layer 221, respectively.

The gap may be the space surrounded by the side wall of the first covering layer 221, the side wall of the second covering layer 222, the side wall of the first stress layer 211, and the side wall of the second stress layer 212, and the surface of the base 200 between the first transistor region I and the second transistor region II.

The first covering layer 221 and the second covering layer 222 may be used to provide crystalline seeds for subsequently forming a third covering layer and a fourth covering layer, so that the crystallographic orientations of the third covering layer and the fourth covering layer may be the same with the crystallographic orientations of the first covering layer 221 and the second covering layer 222.

In one embodiment, the first covering layer 221 and the second covering layer 222 may be made of silicon germanium crystal, in which the germanium concentration may be in a range of approximately 0%~60%. In other words, the first covering layer 221 and the second covering layer 222 can also be made of pure silicon.

As the top surfaces of the first stress layer 211 and the second stress layer 212 protrude from the surface of the base 200, the first covering layer 221 and the second covering layer 222 can grow along both the <111> and the <100> crystallographic directions. Because the growth of the first covering layer 221 and the second covering layer 222 along the <111> crystallographic direction is slower, the first covering layer 221 and the second covering layer 222 can form vertices at the intersections of the two (111) crystalline facets. If the thicknesses of the first covering layer 221 and the second covering layer 222 are too large, the vertices of the first covering layer 221 may be opt to contact with the vertices of the second covering layer 222; if the thicknesses of the first covering layer 221 and the second covering layer 222 are too small, it may be hard to provide high quality crystalline seeds for the subsequently formed third covering layer and fourth covering layer. In one embodiment, the thicknesses of the first covering layer 221 and the second covering layer 222 may be in a range of approximately 10~200 Å.

In one embodiment, the first covering layer 211 and the second covering layer 212 are formed by the selective epitaxial technique. The reactive temperature of the selective epitaxial technique may be in a range of approximately 600~1000° C. and the reactive pressure may be in a range of approximately 1~500 torr. The reactive gases are silicon source gas, germanium source gas, chlorine gas, and hydrogen gas. The silicon source gas may be $SiH_4$, $SiH_2C_2$ or $Si_2C_6$ with a flow rate of approximately 1 slm~1000 sccm. The germanium source gas may be $GeH_4$ with a flow rate of approximately 0~1000 sccm. The flow rates of the chlorine and hydrogen gases may be in a range of approximately 0.1 slm~50 slm.

Figure 8:
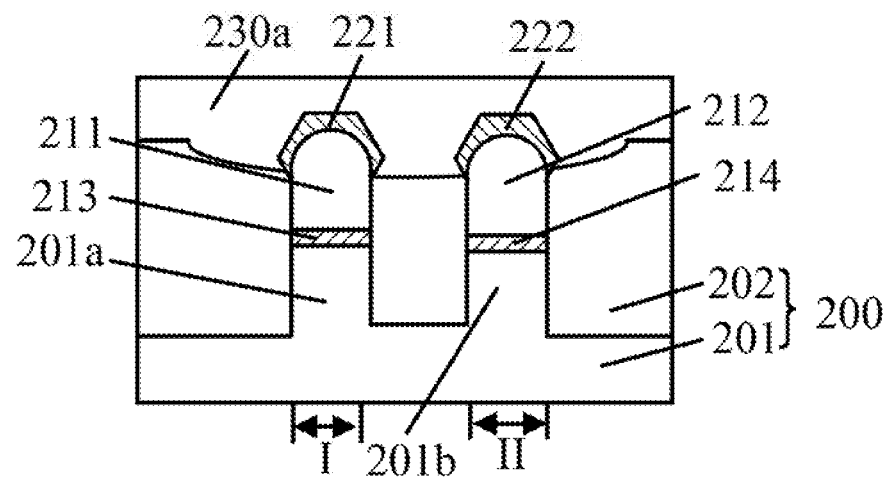

Returning to FIG. 12, after forming the first covering layer and the second covering layer, an isolation layer may be formed (S105). FIG. 8 illustrates a corresponding semiconductor structure.

The isolation layer may be formed in the gap described above. The surface of the isolation layer may be higher than the vertices, and the top surfaces of the first covering layer 221 and the second covering layer 222 may be exposed by the isolation layer.

In one embodiment, the isolation layer and the isolation structure 202 may be made of the same material. In other words, the isolation layer may be made of silicon oxide, such as deep ultraviolet absorption oxide, borophosphosilicate glass or phosphosilicate glass. Using the same material for the isolation layer with the isolation structure 202 can make the isolation layer adhere to the isolation structure 202. In other embodiments, the isolation layer and the isolation structure 202 can also be made of different materials. For example, the isolation layer can also be made of silicon nitride.

The isolation layer may be used to separate the vertices of the first covering layer 221 and the second covering layer 222, limiting the growth directions of the subsequently formed third covering layer and fourth covering layer, so that the third covering layer and the fourth covering layer do not form on the vertices.

More specifically, as shown in FIG. 8, an initial isolation layer 230a may be formed, covering the first covering layer 221 and the second covering layer 222 and filling up the gap.

In one embodiment, the initial isolation layer 230a that covers the first covering layer 221 and the second covering layer 222 and that fills up the gap is formed by a fluid chemical vapor deposition process. The fluid chemical vapor deposition technique can form an initial isolation layer 230a fully filling up the gap, and can effectively avoid the growth of the subsequently formed third covering layer and fourth covering layer on the vertices of the first covering layer 221 and the second covering layer 222.

Figure 9:
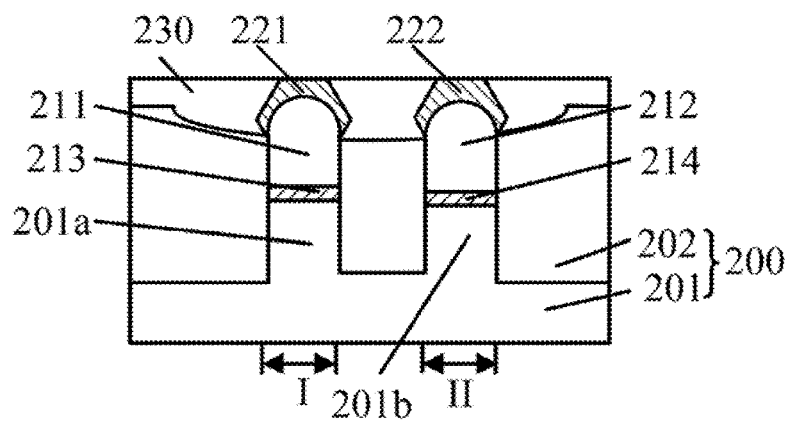

Returning to FIG. 12, after forming the isolation layer, the initial isolation layer on the first covering layer and the second covering layer may be removed (S106). FIG. 9 illustrates a corresponding semiconductor structure.

As shown in FIG. 9, the initial isolation layer 230a on the first covering layer 221 and on the second covering layer 222 (FIG. 8) is removed to expose the first covering layer 221 and the second covering layer 222, and the remaining isolation layer 230a may form the isolation layer 230.

In one embodiment, the initial isolation layer 230a on the first covering layer 221 and the second covering layer 222 may be removed by wet etching, forming the isolation layer 230. In other embodiments, the isolation layer on the first covering layer and the second covering layer can also be removed by dry etching.

In one embodiment, after removing the initial isolation layer 230a on the first covering layer 221 and on the second covering layer 222, the surface of the retained isolation layer 230a in the gap is at the same level with the top surfaces of the first covering layer 221 and the second covering layer 222. That is, the isolation layer 230 covers all the (111) crystalline facets of the first covering layer 221 and the second covering layer 222 and exposes only the (100) crystalline facets. Therefore, the isolation layer 230 can substantially limit the growth directions of the third covering layer and the fourth covering layer. In other embodiments, the isolation layer can also be formed by the fluid chemical vapor deposition technique, with the surface of the isolation layer higher than the position of the vertices, but lower than the top surfaces of the first covering layer and the second covering layer.

Figure 10:
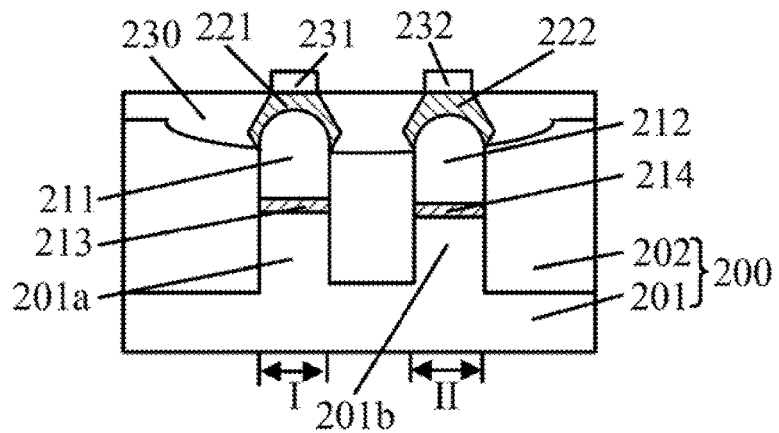

Returning to FIG. 12, after removing the isolation layer on the first covering layer and the second covering layer, a third covering layer and a fourth covering layer may be formed (S107). FIG. 10 illustrates a corresponding semiconductor structure.

As shown in FIG. 10, a third covering layer 231 is formed on the first covering layer 221 and a fourth covering layer 232 is formed on the second covering layer 222 by, for example, an epitaxial growth process.

The third covering layer 231 and the fourth covering layer 232 may be used to provide crystalline seeds for subsequently forming the metal silicide, so that the crystallographic orientations of the third covering layer 231 and the fourth covering layer 232 may be the same with the crystallographic orientations of the first covering layer 221 and the second covering layer 222.

In one embodiment, the third covering layer 231 and the fourth covering layer 232 may be made of the same material with the first covering layer 221 and the second covering layer 222. Using the same material for the first covering layer 221, the second covering layer 222, the third covering layer 231, and the fourth covering layer 232 can increase the lattice match between the first covering layer 221 and the third covering layer 231 and increase the lattice match between the second covering layer 222 and the fourth covering layer 232. Thus, the defects in the third covering layer 231 and in the fourth covering layer 232 may be reduced and the crystalline quality of the third covering layer 231 and the fourth covering layer 232 is improved.

In one embodiment, the third covering layer 231 and the fourth covering layer 232 are formed by the selective epitaxial growth technique, and the technical parameters of the selective epitaxial growth technique may be the same as the technical parameters for forming the first covering layer 221 and the second covering layer 222.

In one embodiment, because the isolation layer 230 covers all the (111) crystalline facets of the first covering layer 221 and the second covering layer 222 and exposes only the (100) crystalline facets, in the process of forming the third covering layer 231 and the fourth covering layer 232 by epitaxial growth, the third covering layer 231 and the fourth covering layer 232 can only grow along the <100> crystallographic direction. In other words, the third covering layer 231 and the fourth cover layer 232 can only grow upwards. In other embodiments, the isolation layer 230 can also cover only a part of the (111) crystalline facets of the first covering layer 221 and the second covering layer 222, and thus the third covering layer 231 and the fourth covering layer 232 can also form on the (111) crystalline facets of the first covering layer 201 and the second covering layer 222 that are exposed by the isolation layer 230.

Therefore, in one embodiment, the thicknesses of the third covering layer 231 and the fourth covering layer 232 are not restricted by the width of the isolation layer 202 between the first stress layer 211 and the second stress layer 212. In other words, the total thickness of the first covering layer 221 and the third covering layer 231 and the total thickness of the second covering layer 222 and the fourth covering layer 232 can be relatively large. However, if the thicknesses of the third covering layer 231 and the fourth covering layer 232 are too large, the integration degree of semiconductor devices will be affected. In one embodiment, the thicknesses of the third covering layer 231 and the fourth covering layer 232 may be in a range of approximately 30~100 Å.

In one embodiment, the distance between the third covering layer 231 and the fourth covering layer 232 may be determined by the distance between the first covering layer 221 and the second covering layer 222 that are exposed by the isolation layer 230. In one embodiment, the third covering layer 231 may only be formed on the exposed (100) facets of the first covering layer 221, and the fourth layer 232 may only be formed on the exposed (100) facets of the second covering layer 222. Therefore, the distance between the third covering layer 231 and the fourth covering layer 232 may be the distance between the (100) facets of the first covering layer 221 and the second covering layer 222.

In the disclosed embodiment, if the thickness of the isolation structure 202 between the first stress layer 211 and the second stress layer 212 is too large, it is not good for increasing the integration degree of the formed semiconductor devices; if the thickness of the isolation structure 202 between the first stress layer 211 and the second stress layer 212 is too small, it tends to cause a contact between the first covering layer 221 and the second covering layer 222 or cause a contact between the third covering layer 231 and the fourth covering layer 232. In one embodiment, because the thicknesses of the first covering layer 231 and the second covering layer 232 are relatively small, the thickness of the isolation structure 202 between the first stress layer 211 and the second stress layer 212 can be as small as there is no contact between the first covering layer 221 and the second covering layer 222 or between the third covering layer 231 and the fourth covering layer 232. In one embodiment, the thickness of the isolation structure 202 between the first stress layer 211 and the second stress layer 212 may be in a range of approximately 28 nm~1 µm.

Further, after forming the third covering layer 231 on the first covering layer 221 and forming the fourth covering layer 232 on the second covering layer 222 by epitaxial growth, the disclosed fabrication method of a semiconductor structure also includes metallizing the first covering layer 221, the second covering layer 222, the third covering layer 231, and the fourth covering layer 232 to form a metal silicide. The formed metal silicide can electrically connect the transistor with external circuits.

Specifically, the procedures to form the metal silicide include forming a metallic layer on the first covering layer 221, the second covering layer 221, the third covering layer 231, and the fourth covering layer, so that the metal atoms can be diffused into the first covering layer 221, the second covering layer 222, the third covering layer 231, and the fourth covering layer 232 to form the metal silicide.

Thus, by using the disclosed fabrication process to form a semiconductor structure, after forming the first stress layer and the second stress layer, the first covering layer that covers the first stress layer and the second covering layer that covers the second stress layer are then formed. The first covering layer and the second covering layer are used to provide crystalline seeds for subsequently forming the third covering layer and the fourth covering layer, respectively, so that the third covering layer and the fourth covering layer have the same crystallographic orientations with the first covering layer and the second covering layer. After forming the first covering layer and the second covering layer, an isolation layer that fills up the gap between the first covering layer and the second covering layer is formed. The surface of the isolation layer is higher than the vertices of the first covering layer and the second covering layer. Thus, the growth of the third covering layer and the fourth covering layer along the vertex direction is limited. During the process of forming the third covering layer and the fourth covering layer by epitaxial growth, the third covering layer and the fourth covering layer do not grow along the vertex direction. Therefore, the contact between the third covering layer and the fourth covering layer is avoided, and further the contact between the metal silicide formed in the first transistor region and the second transistor region is avoided, achieving electrical insulating between different semiconductor devices.

Figure 11:
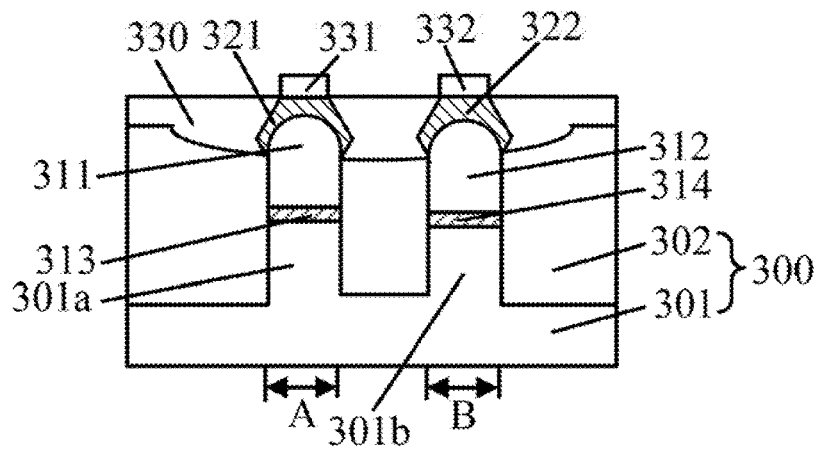
FIG. 11 illustrates a semiconductor structure consistent with the disclosed embodiments.

FIG. 11 illustrates a semiconductor structure corresponding to the disclosed fabrication process. As shown in FIG. 11, a base 300 containing a first transistor region "A" and an adjacent second transistor region "B" is provided.

In one embodiment, the first transistor region "A" and the second transistor region "B" are used to form a Fin-FET. In other embodiments, the first transistor region "A" and the second transistor region "B" can also be used to form a planar transistor.

Accordingly, in one embodiment, the base 300 includes a substrate 301 and an isolation structure 302 on the substrate 301. The substrate 301 includes a first fin portion 301a in the first transistor region "A" and a second fin portion 301b in the second transistor region "B". The first fin portion 301a and the second fin portion 301b are used to form the drain and source regions of the Fin-FET.

In one embodiment, the substrate 301 is made of silicon. In other embodiments, the substrate 301 can also be made of any other appropriate semiconductor, such as germanium, silicon germanium or silicon on an insulator.

In one embodiment, the isolation structure 302 is a shallow trench isolation structure. The isolation structure 302 is made of silicon oxide. However, in the disclosed semiconductor structure there is no restriction on the material of the isolation structure 302. The isolation structure 302 can also be made of silicon nitride or silicon oxynitride.

As shown in FIG. 11, the first stress layer 311 is in the first transistor region "A" of the base 300, and the second stress layer 312 is in the second transistor region "B" of the base 300. The first stress layer 311 and the second stress layer 312 are exposed by the base 300.

The first stress layer 311 and the second stress layer 312 are used to provide stress for channels of the transistor.

In one embodiment, a PMOS transistor is formed in the first transistor region "A". The corresponding first stress layer 311 made of is silicon germanium, and the germanium concentration in the first stress layer 311 may be in a range of approximately 25%~50%. In other embodiments, the first transistor region can also be used to form an NMOS transistor, and the corresponding first stress layer is made of silicon carbide.

In one embodiment, a PMOS transistor is formed in the second transistor region "B". The corresponding second stress layer 312 is made of silicon germanium, and the germanium concentration in the second stress layer 312 may be in a range of approximately 25%~50%. In other embodiments, the second transistor region can also be used to form an NMOS transistor, and the corresponding second stress layer is made of silicon carbide.

In one embodiment, there are a first trench in the first transistor region "A" and a second trench in the second transistor region "B". The first trench and the second trench are used to hold the first stress layer 311 and the second stress layer 312.

The depth of the first trench and the second trench is smaller than the thickness of the first stress layer 311 and the second stress layer 312. Specifically, in one embodiment, the depth of the first trench and the second trench may be in a range of approximately 50~100 Å.

Further, if the thickness of the first stress layer 311 is too large, the integration degree of semiconductor devices will be affected; if the thickness of the first stress layer 311 is too small, it is hard to provide sufficient stress for the transistor channels. Therefore, the thickness of the first stress layer 311 should not be too small. Specifically, in one embodiment, the thickness of the first stress layer 311 may be in a range of approximately 100~300 Å. In other words, the depth of the first trench is smaller than the thickness of the first stress layer 311. Thus, the top surface of the first stress layer 311 protrudes from the first trench.

Similarly, if the thickness of the second stress layer 312 is too large, the integration degree of semiconductor devices will be affected; if the thickness of the second stress layer 312 is too small, it is hard to provide sufficient stress for the channels of the transistor. Therefore, the thickness of the second stress layer 312 should not be too small. Specifically, in one embodiment, the thickness of the second stress layer 312 may be in a range of approximately 100~300 Å. In other words, the depth of the second trench is smaller than the thickness of the second stress layer 312. Therefore, the top surface of the second stress layer 312 protrudes from the second trench.

In one embodiment, the semiconductor structure also includes a first seed layer 313 under the first stress layer 311. The first seed layer 313 is used to smoothly change the lattice constant from the substrate 301 to the first stress layer 311, and increase the lattice match between the first stress layer 311 and the crystal interface on which the first stress layer grows. Thus, the crystalline quality of the first stress layer 311 is improved.

In one embodiment, the substrate 301 is made of silicon. The first stress layer 311 is made of the silicon germanium crystal. The first seed layer 313 is made of the silicon germanium crystal, and the germanium concentration in the first seed layer 312 is smaller than the germanium concentration in the first stress layer 311. Specifically, the germanium concentration in the first seed layer 313 may be in a range of approximately 5%~25%.

Similarly, in one embodiment, the semiconductor structure also includes a second seed layer 314 under the second stress layer 312. The second seed layer 313 is used to smoothly change the lattice constant from the substrate 301 to the second stress layer 312, and increase the lattice match between the second stress layer 312 and the crystal interface on which the second stress layer grows. Thus, the crystalline quality of the second stress layer 312 is improved.

In one embodiment, the substrate 301 is made of silicon. The second stress layer 312 is made of the silicon germanium crystal. The second seed layer 314 is made of the silicon germanium crystal, and the germanium concentration in the second seed layer 314 is smaller than the germanium concentration in the second stress layer 312. Specifically, the germanium concentration in the second seed layer 314 may be in a range of approximately 5%~25%.

As shown in FIG. 11, the first covering layer 321 is on the surface of the first stress layer 311, and the second covering layer 322 is on the surface of the second stress layer. The neighboring side walls of the first covering layer 321 and the second covering layer 322 have vertices pointing to each other.

The first covering layer 321 and the second covering layer 322 are used to provide crystalline seeds for subsequently forming the third covering layer and the fourth covering layer, so that the crystallographic orientations of the third covering layer and the fourth covering layer are the same with the crystallographic orientations of the first covering layer and the second covering layer, respectively.

In one embodiment, the first covering layer 321 and the second covering layer 322 are made of silicon germanium crystal, and the silicon concentration may be in a range of approximately 0~60%. In other words, the first covering layer 321 and the second covering layer 322 can also be made of pure silicon.

If the thicknesses of the first covering layer 321 and the second covering layer 322 are too large, it tends to make the vertices of the first covering layer 321 and the second covering layer 322 contact with each other; if the thicknesses of the first covering layer 321 and the second covering layer 322 are too small, it is hard to provide high quality crystalline seeds for the growth of the third covering layer and the fourth covering layer to make the crystallographic orientations of the third covering layer and the fourth covering layer the same with the crystallographic orientations of the first covering layer 321 and the second covering layer 322. Therefore, in one embodiment, the thicknesses of the first covering layer 321 and the second covering layer 322 may be in a range of approximately 10~200 Å.

As shown in FIG. 11, the isolation layer 330 is between the first covering layer 321 and the second covering layer 322, and the surface of the isolation layer 330 is higher than the position of the vertices. Further, the top surfaces of the first covering layer 321 and the second covering layer 322 are exposed by the isolation layer 330.

The isolation layer 330 is used to isolate the first covering layer 321 and the second covering layer 322 and limit the growth directions of the subsequently formed third covering layer and fourth covering layer, so that growth of the third covering layer and the fourth covering layer on the vertices of the first covering layer 321 and the second covering layer 322 is avoided.

In one embodiment, the isolation layer 330 and the isolation structure 302 are made of the same material. In other words, the isolation layer 330 is made of silicon oxide, such as, deep ultraviolet absorption oxides, borophosphosilicate glass or phosphosilicate glass. Using the same material for the isolation layer 330 with the isolation structure 302 can make the isolation layer 330 well adhere to the isolation structure 302. In other embodiments, the isolation layer and the isolation structure can also be made of different materials. For example, the isolation layer can also be made of silicon nitride.

In one embodiment, the surface of the isolation layer 330 is at the same level with the top surfaces of the first covering layer 321 and the second covering layer 322. In other words, the isolation layer 330 covers the (111) crystal facets of the first covering layer 321 and the second covering layer 322 and expose only the (100) crystal facets. In other embodiments, the surface of the isolation layer 330 can also be higher than the position of the vertices, but lower than the top surfaces of the first covering layer 321 and the second covering layer 322.

As shown in FIG. 11, the third covering layer 331 is on the surface of the first covering layer 321, and the fourth covering layer 332 is on the surface of the second covering layer 322.

The third covering layer 331 and the fourth covering layer 332 are used to provide crystalline seeds for subsequently forming the metal silicide, so that the crystallographic orientations of the third covering layer 331 and the fourth covering layer 332 are the same with the crystallographic orientations of the first covering layer 321 and the second covering layer 322.

In one embodiment, the third covering layer 331 and the fourth covering layer 332 are made of the same material with the first covering layer 321 and the second covering layer 322. Using the same material for the first covering layer 321, the second covering layer 322, the third covering layer 331, and the fourth covering layer 332 can increase the lattice match between the first covering layer 321 and the third covering layer 331, and increase the lattice match between the second covering layer 322 and the fourth layer 332. Thus, the defects in the third covering layer 331 and the fourth covering layer 332 are reduced and the crystalline quality of the third covering layer 331 and the fourth covering layer 332 is improved.

In one embodiment, the isolation layer 330 covers the (111) crystal facets of the first covering layer 321 and the second covering layer 322 and exposes only the (100) crystal facets. Thus, the third covering layer 331 is only on the (100) crystal facets of the first covering layer 321 and the fourth covering layer 332 is only on the (100) crystal facets of the second covering layer 322. In other embodiments, the isolation layer can also cover only a part of the (111) facets of the first covering layer and the second covering layer. Therefore, the third covering layer can also form on the (111) facets of the first covering layer that are exposed by the isolation layer, and the fourth covering layer can also form on the (111) facets of the second covering layer that exposed by the isolation layer.

In one embodiment, the thickness of the third covering layer 331 and the fourth covering layer 332 is unrestricted by the width of the isolation structure 302 between the first stress layer 311 and the second stress layer 312. In other words, the total thickness of the first covering layer 321 and the third covering layer 331 and the total thickness of the second covering layer 322 and the fourth covering layer 332 can be relatively large. However, if the thickness of the third covering layer 331 and the fourth covering layer 332 is too large, the integration degree of semiconductor devices can be affected. Specifically, the thickness of the third covering layer 331 and the fourth covering layer 332 may be in a range of approximately 30~100 Å.

If the thickness of the isolation structure 302 between the first stress layer 311 and the second stress layer 312 is too large, it is not good for increasing the integration degree of the formed semiconductor devices; if the thickness of the isolation structure 302 between the first stress layer 311 and the second stress layer 312 is too small, it can easily cause a contact between the first covering layer 311 and the second covering layer 312 or a contact between the third covering layer 331 and the fourth covering layer 332. In one embodiment, the thicknesses of the first covering layer 321 and the second covering layer 322 are relatively small. Thus, the thickness of the isolation structure 302 between the first stress layer 311 and the second stress layer 312 can be as small as there is no contact between the first covering layer 321 and the second covering layer 322. Specifically, the thickness of the isolation structure 302 between the first stress layer 311 and the second stress layer 312 may be in a range of approximately 28 nm~1 μm.

In summary, in the semiconductor structure of the disclosed invention, an isolation layer is between the first covering layer and the second covering layer, and the surface of the isolation layer is higher than the vertices of the first covering layer and the second covering layer. Thus, there is no the third covering layer or the fourth covering layer on the vertices, avoiding the contact between the third covering layer and the fourth covering layer. In addition, the first covering layer and the second covering layer are relatively thin, and the first covering layer and the second covering layer are unable to contact.

The above detailed descriptions only illustrate certain embodiments of the disclosed invention, and are not intended to limit the scope of the disclosed invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method of forming a semiconductor structure, comprising of:
    providing a base having a first transistor region and a second transistor region adjacent to the first transistor region;
    forming a first stress layer in the first transistor region and a second stress layer in the second transistor region, with the first stress layer and the second stress layer exposing part of a surface of the base;
    forming a first covering layer on a surface of the first stress layer and a second covering layer on a surface of the second stress layer by epitaxial growth, with a gap between the first covering layer and the second covering layer exposing the surface of the base, and the neighboring side walls of the first covering layer and the second covering layer have vertices pointing to each other;
    forming an isolation layer filling up the gap, and a top surface of the isolation layer is higher than the vertices, exposing top surfaces of the first covering layer and the second covering layer, wherein the top surface of the isolation layer is coplanar with the top surfaces of the first covering layer and the second covering layer; and
    forming a third covering layer on the first covering layer and a fourth covering layer on the second covering layer by epitaxial growth exposing the top surface of the isolation layer.

2. The method according to claim 1, wherein forming an isolation layer filling up the gap further includes:
    forming an initial isolation layer covering the first covering layer and the second covering layer and filling up the gap; and
    removing the initial isolation layer that is on the top surfaces of the first covering layer and the second covering layer while retaining the initial isolation layer filling up the gap to form the isolation layer.

3. The method according to claim 2, wherein:
    the initial isolation layer is formed by using a fluid chemical vapor deposition process.

4. The method according to claim 2, wherein:
    the initial isolation layer is removed by wet etching or dry etching.

5. The method according to claim 1, wherein:
the base includes a substrate and an isolation structure between the first transistor region and the second transistor region.

6. The method according to claim 5, wherein forming a first stress layer in the first transistor region and a second stress layer in the second transistor region further includes:
forming a mask layer on the surface of the base, exposing the base within the first transistor region and the second transistor region, and the isolation structure surface between the first transistor region and the second transistor region;
etching the base using the mask layer as a mask to form a first trench in the first transistor region and a second trench in the second transistor region; and
forming the first stress layer in the first trench and the second stress layer in the second trench.

7. The method according to claim 1, wherein:
the top surface of the isolation layer is at a same level as the top surfaces of the first covering layer and the second covering layer when forming the initial isolation layer.

8. The method according to claim 7, wherein:
a thickness of the third covering layer and the fourth covering layer is in a range of approximately 30~100 Å; and
side surfaces of the third covering layer and side surfaces of the fourth covering layer are perpendicular to the top surface of the isolation layer.

9. The method according to claim 1, wherein:
the isolation layer is made of deep ultraviolet absorbing oxide, borophosphosilicate glass, or phosphosilicate glass.

10. The method according to claim 1, wherein:
a thickness of the isolation layer is in a range of approximately 10~500 Å.

11. The method according to claim 1, wherein:
a thickness of the first covering layer and the second covering layer is in a range of approximately 10~200 Å.

12. The method according to claim 1, wherein:
a width of the base between the first stress layer and the second stress layer in a range of approximately 28 nm~1 µm.

13. The method according to claim 1, wherein:
the first covering layer, the second covering layer, the third covering layer, and the fourth covering layer are made of a same material.

14. The method according to claim 1, wherein:
the first covering layer, the second covering layer, the third covering layer, and the fourth covering layer are made of silicon germanium.

15. A semiconductor structure, comprising:
a base having a first transistor region and a second transistor region;
a first stress layer in the first transistor region and a second stress layer in the second transistor region of the base, wherein the base is exposed by the first stress layer and the second stress layer;
a first covering layer and a second covering layer formed on surfaces of the first stress layer and the second stress layer, respectively, and side walls of the first covering layer and the second covering layer have vertices pointing to each other;
an isolation layer between the first covering layer and the second covering layer, and a top surface of the isolation layer is higher than the vertices, exposing the surfaces of the first covering layer and the second covering layer, wherein the top surface of the isolation layer is coplanar with the top surfaces of the first covering layer and the second covering layer; and
a third covering layer and a fourth covering layer formed on the surfaces of the first covering layer and the second covering layer, respectively, and exposing the top surface of the isolation layer.

16. The structure according to claim 15, wherein:
the top surface of the isolation layer is at a same level with the surfaces of the first covering layer and the second covering layer.

17. The structure according to claim 15 or 16, wherein:
a thickness of the third covering layer and the fourth covering layer is in a range of approximately 30~100 Å; and
side surfaces of the third covering layer and side surfaces of the fourth covering layer are perpendicular to the top surface of the isolation layer.

18. The structure according to claim 15, wherein:
a width of the base between the first stress layer and the second stress layer is in a range of approximately 28 nm~1 µm;
a thickness of the first covering layer and the second covering layer is in a range of approximately 10~200 Å; and
a thickness of the isolation layer between the first covering layer and the second covering layer is in a range of approximately 10~500 Å.

19. The structure according to claim 15, wherein:
the isolation layer is made of deep ultraviolet absorbing oxide, borophosphosilicate glass, or phosphosilicate glass.

20. The structure according to claim 15, wherein:
the first covering layer, the second covering layer, the third covering layer, and the fourth covering layer are made of a same material.

* * * * *